United States Patent [19]

Ikawa

[11] Patent Number: 5,324,993
[45] Date of Patent: Jun. 28, 1994

[54] DATA OUTPUT CIRCUIT FOR SEMICONDUCTOR INTEGRATED CIRCUIT DEVICE

[75] Inventor: Tatsuo Ikawa, Kawasaki, Japan

[73] Assignee: Kabushiki Kaisha Toshiba, Kawasaki, Japan

[21] Appl. No.: 917,328

[22] Filed: Jul. 23, 1992

[30] Foreign Application Priority Data

Jul. 23, 1991 [JP] Japan .................. 3-182551

[51] Int. Cl.⁵ .................. H03K 19/00; G06F 7/02
[52] U.S. Cl. .................. 307/269; 307/582; 340/146.2
[58] Field of Search ............ 307/358, 269, 571, 582, 307/585; 340/146.2

[56] References Cited

U.S. PATENT DOCUMENTS

| | | | |
|---|---|---|---|
| 4,414,676 | 11/1983 | Kraul et al. | 340/146.2 |
| 4,528,660 | 7/1985 | Gentry | 340/146.2 |
| 4,725,812 | 2/1988 | Kloppe | 340/146.2 |

FOREIGN PATENT DOCUMENTS 60-83297  5/1985  Japan .
63-171005  7/1988  Japan .

*Primary Examiner*—John Zazworsky
*Attorney, Agent, or Firm*—Foley & Lardner

[57] ABSTRACT

A data output circuit for a semiconductor integrated circuit device for outputting a data signal in sync with an output enable signal externally supplied, including: a comparing circuit for comparing a first data signal being outputted presently with a second data signal to be outputted next, when the data signal to be outputted is changed, and judging whether the first and second data signals are the same or different; a first output circuit for temporarily turning off output transistors and outputting the second data, if the comparing circuit judges that the first and second data signals are different; and a second output circuit for outputting the second data signal without turning off all the output transistors, if the comparing circuit judges that the first and second data signals are the same.

3 Claims, 8 Drawing Sheets

DATA OUTPUT CIRCUIT FOR SEMICONDUCTOR INTEGRATED CIRCUIT DEVICE

BACKGROUND OF THE INVENTION

The present invention relates to a data output circuit for a semiconductor integrated circuit device.

A semiconductor integrated circuit device, particularly a semiconductor memory device, has a data output circuit for outputting internal data to an external device.

This data output circuit temporarily latches data transferred from an internal circuit. The latched data is supplied to the output circuit in sync with the timing of an output enable signal. The output circuit charges or discharges an output side node in accordance with the supplied data level, to thereby output the data to the external device.

It is necessary to raise or lower the potential at an output terminal at high speed, in order to output data to the external device. If the capacitance of an external load at the output terminal is large, the load cannot be driven at high speed unless a large output current is supplied.

SUMMARY OF THE INVENTION

It is therefore an object of the present invention to provide a data output circuit for a semiconductor integrated circuit capable of obtaining a large output current and outputting data at high speed.

According to one aspect of the present invention, a data output circuit of a semiconductor integrated circuit device for outputting a data signal in sync with an, output enable signal externally supplied, includes: means for comparing a first data signal being outputted presently with a second data signal to be outputted next, when the data signal to be outputted is changed, and judging whether the first and second data signals are the same or different; first output means for temporarily turning off output transistors and outputting the second data, if the comparing means judges that the first and second data signals are different; and second output means for outputting the second data signal without turning off all the output transistors, if the comparing means judges that the first and second data signals are the same.

The comparing means compares the first data signal being outputted presently with the second data signal to be outputted next, and judges whether the first and second data signals are the same or different. The first output means temporarily turns off output transistors and outputting of the second data, if the comparing means judges that the first and second data signals are different. If the comparing means judges that the first and second data signals are the same, the second data continues to be outputted without turning off all the output transistors. Therefore, the time period required for outputting the second data can be shortened, and the output level can be prevented from being lowered because all the output transistors are not turned off but they hold the same operation state.

According to another aspect of the present invention, a data output circuit for a semiconductor integrated circuit device for outputting a data signal in sync with an output enable signal externally supplied, comprising: an output data latch circuit for latching the data signal; an output data reset circuit for receiving a second data signal to be outputted next and an output data reset control signal, comparing the second data signal with a first data signal held by the output data latch circuit, in sync with the output data reset control signal, resetting the output data latch circuit if the first and second output data signals are judged as different, and making a hold state of the output data latch circuit continue if the first and second output data signals are judged as the same; an output data transfer circuit for receiving the second data signal and an output data transfer control signal, and supplying the second data signal to the output data latch circuit to latch the second data signal in sync with the output data transfer control signal; an output control circuit for receiving the output enable signal and the second data signal latched by the output data latch circuit, and outputting the second data signal in sync with the output enable signal; a high level output circuit for receiving the second data signal if the second data signal outputted from the output control circuit is at a high level, turning on an output transistor for a high level signal, and outputting the second data signal; and a low level output circuit for receiving the second data signal if the second data signal outputted from the output control circuit is low level, turning on an output transistor for a low level signal, and outputting the second data signal.

The output data latch circuit is holding the first data signal being outputted presently. The output data reset circuit compares the second data signal with the first data signal, in sync with the output data reset control signal. The output data reset circuit resets the output data latch circuit if the first and second output data signals are judged as different, and makes a hold state of the output data latch circuit continue if the first and second output data signals are judged as the same. The output data transfer circuit supplies supplying the second data signal to the output data latch circuit to latch the second data signal in sync with the output data transfer control signal. The output control circuit outputs the second data signal in sync with the output enable signal. The high level output circuit receives the second data signal if the second data signal outputted from the output control circuit is high level, turns on the output transistor for a high level signal, and outputs the second data signal. The low level output circuit receives the second data signal if the second data signal outputted from the output control circuit is low level, turns on the output transistor for a low level signal, and outputs the second data signal. If the output data reset circuit judges that the first and second data signals are the same, the output data latch circuit is not reset but it maintains the state of holding the first data signal. Therefore, if the second data signal takes the high level, the output transistor for a high level signal of the high level output circuit maintains its on-state, and if the second data signal takes the low level, the output transistor for a low level signal of the low level output circuit maintains its on-state. Accordingly, if the first and second data signals are the same, all the output transistors are not turned off but the second data signal is outputted continuously after the first data signal, thereby shortening the data output time period and preventing the output level from being lowered.

The output data reset circuit may be connected to a first node and a second node, to change the potentials at the first and second nodes to reset potentials if the first and second data signals are judged as different, and to maintain the potentials at the first and second nodes if the first and second data signals are judged as the same.

The output data latch circuit may be connected to the first and second nodes, to reset the contents of the output data latch circuit if the potentials at the first and second nodes are changed to the reset potentials, and to maintain the contents of the output data latch circuit if the potentials at said first and second nodes are to be maintained. The output data transfer circuit may change the potentials at the first and second nodes to the contents of the second data signal in sync with the output data transfer control signal.

If the first and second data signals are judged as different, the potentials at the first and second nodes are changed to the reset potentials, and if the first and second data signals are judged as the same, the potentials at the first and second nodes are maintained unchanged. The output data latch circuit resets the holding state if the potentials at the first and second nodes are changed to the reset potentials, and maintains the contents of the output data latch circuit if the potentials at said first and second nodes are to be maintained. The output data transfer circuit changes the potentials at the first and second nodes to the contents of the second data signal in sync with the output data transfer control signal. In the above manner, the potentials at the first and second nodes are maintained and the output data latch circuit maintains the state of holding the first data signal, if the first and second data signals are the same. Therefore, one of the output transistors for high level and low level signals maintains its on-state without turning off all the output transistors, and outputting the second data signal continuously after the first data signal.

DESCRIPTION OF THE PREFERRED EMBODIMENTS

Embodiments of the present invention will be described with reference to the accompanying drawings.

Figure 1:
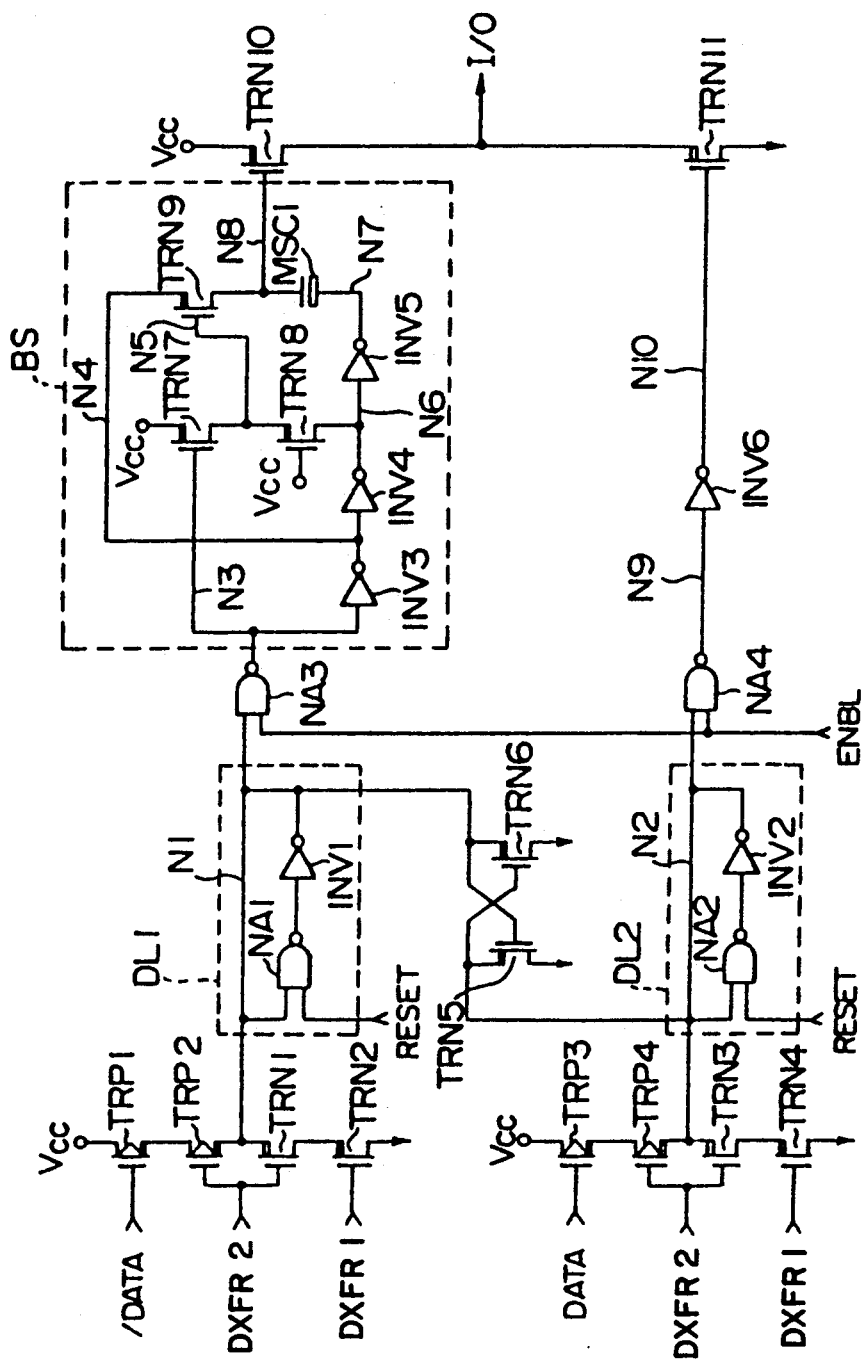
FIG. 1 is a circuit diagram showing the structure of a first embodiment of a data output circuit of a semiconductor integrated circuit device.

The structure of the data output circuit according to the first embodiment of the present invention is shown in FIG. 1. A P-channel transistor TRP2 and an N-channel transistor TRN1 constitute an inverter to the gate of which a data transfer control signal $\overline{DXFR2}$ is inputted, and the output terminal of which is connected to a node N1. A P-channel transistor TRP1 is connected between the source of the P-channel transistor TRP2 and a power supply voltage $V_{CC}$ terminal, and an N-channel transistor TRN2 is connected between the N-channel transistor TRN1 and a ground terminal. A data signal $\overline{DATA}$ is inputted to the gate of the P-channel transistor TRP1, and a data transfer control signal DXFR1 is inputted to the gate of the N-channel transistor TRN2.

Connected to the node N1 is a data latch circuit DL1 constructed of a NAND circuit NA1 and an inverter INV1, the output terminal of the data latch circuit DL1 is connected to one input terminal of a NAND circuit NA3. One input terminal of the NAND circuit NA1 is connected to the node N1, and the other input terminal thereof is supplied with a reset signal RESET. The output terminal of the NAND circuit NA1 is connected to the input terminal of the inverter INVL. The output terminal of inverter INV1 which is connected to the input terminal of the inverter INV1. The output terminal of the inverter INV1 is connected to the node N1. An output enable signal ENBL is inputted to the other input terminal of the NAND circuit NA3.

Connected via a node N3 to the output terminal of the NAND circuit NA3 is a bootstrap circuit BS which is constructed of N-channel transistors TRN7 to TRN9, inverters INV3 to INV5 and an N-channel MOS type capacitor MSC1. The node N3 is connected to the gate of the N-channel transistor TRN7 and to the input terminal of the inverter train INV3 to INV5. The N-channel transistor TRN7 has its drain connected to the power supply voltage $V_{CC}$ terminal and its source connected to a node N5. The N-channel transistor TRN8 has its drain connected to the node N5 and its source connected to a node N6 which connects together the output terminal of the inverter INV4 and the input terminal of the inverter INV5. Connected to a node N4 connecting the output terminal of the inverter INV3 to the input terminal of the inverter INV4, is the drain of the N-channel transistor TRN9. Its source is connected to the node N8 and the gate of which is connected to the node N5. The capacitor MSC1 is connected between a node N7 at the output terminal of the inverter INV5 and the node N8. The node N8 is connected to the gate of an N-channel transistor TRN10 which is one of a pair of output transistors. The drain of the N-channel transistor TRN10 is connected to the power supply voltage $V_{CC}$ terminal, and the source thereof is connected to an output terminal I/O.

The connections among P-channel transistors TRP3 and TRP4 and N-channel transistors TRN3 and TRN4 are similar to the above-described P-channel transistors TRP1 and TRP2 and N-channel transistors TRN1 and TRN2. The different point is that a data signal DATA is inputted to the gate of the P-channel transistor TRP3. Connected to a node N2 connected together the drain of the P-channel transistor TRP4 and the N-channel transistor TRN3, is a data latch circuit DL2 constructed of a NAND circuit NA2 and an inverter INV2. The structure of the data latch circuit DL2 is similar to the data latch circuit DL1. The node N2 is connected to one input terminal of a NAND circuit NA4 the other input terminal of which is inputted by the output enable signal ENBL. An inverter INV6 is connected to a node N9 at the output terminal of the NAND circuit NA4. A node N10 at the output terminal of the inverter INV6 is connected to the gate of an N-channel transistor TRN11 which is the other of the pair of the output transistors including the N-channel transistor TRN10. The drain of the N-channel transistor TRN11 is connected to the output terminal I/O. Connected between the nodes N1 and N2 is a flip-flop constructed of N-channel transistors TRN5 and TRN6, the flip-flop operating to set both the potentials at the nodes N1 and N2 to the low level, or set one potential to the low level and the other potential to the high level.

The data output circuit having the above-described structure operates in the following manner. If data is not to be outputted, the output enable signal ENBL is set to the low level, the data transfer control signal $\overline{\text{DXFR1}}$ is set to the low level, and so the inverted data transfer control signal $\overline{\text{DXFR2}}$ is set to the high level.

If data is to be outputted, the output enable signal ENBL is set to the high level, the data transfer control signal DXFR1 is set to the high level, and so the inverted data transfer control signal DXFR2 is set to the low level. The reset signal takes the low level when powered on or reset, and it is set to the high level when data is to be outputted.

A data output operation for the data signal DATA of high level and inverted data signal $\overline{\text{DATA}}$ of low level, will first be described. The relationship between potentials at the nodes N1, N3 to N5, N7 and N8, at the output terminal I/O, and of the output enable signal ENBL, is shown in the time chart of FIG. 2. The potential at the node N1 takes the high level which is held by the data latch circuit DL1. The output enable signal ENBL rises, and so the node N3 takes the low level via the NAND circuit NA3 and the node N4 takes the high level via the inverter INV3. The node 5 has been charged in advance to a potential (power supply voltage $V_{CC}$)−(threshold voltage $V_{th}$) so that the N-channel transistor TRN9 is in a conductive state. Therefore, as the potential at the node N4 rises, the potential at the node N8 rises. The node N6 takes the high level and the transistors TRN7 and TRN8 are of an off-state. The potential at the node N5 therefore rises to higher than the power supply voltage $V_{CC}$ because of the gate capacitance of the transistor TRN9. When the potential at the node N6 takes the low level via the inverter INV4, the transistor TRN8 becomes conductive, and the potential at the node N5 takes the low level. The transistor TRN9 therefore turns off. The potential at the node N7 takes the high level via the inverter INV5, and the potential at the node N8 rises higher than the power supply voltage $V_{CC}$, the potential being determined by a ratio of the capacitor MSC1 to the gate capacitance of the transistor TRN10. The transistor TRN10 becomes conductive, and a high level signal is outputted from the output terminal I/O. The transistor TRN10 performs triode action because the gate voltage rises higher than the drain voltage. As a result, under the condition that a load is not connected to the output terminal I/O, the potential at the output terminal I/O can take a level up to the power supply voltage $V_{CC}$.

Figure 3:
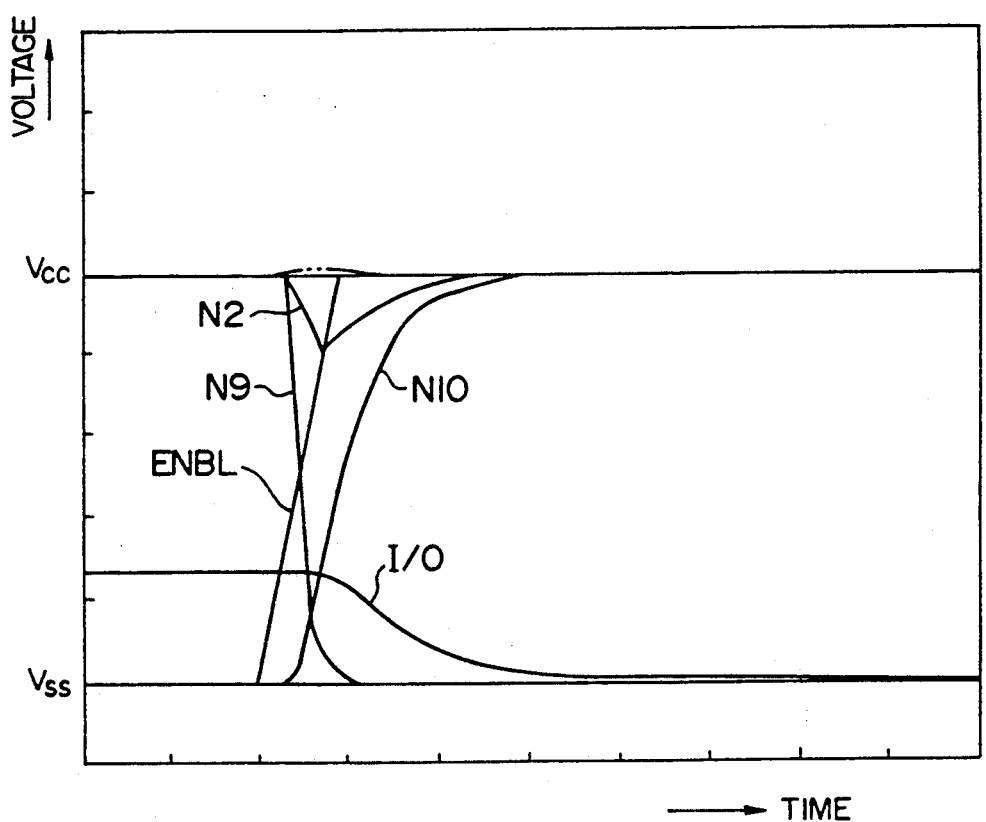
FIG. 3 is a time chart showing potential changes at nodes of the data output circuit when it outputs a low level.

If the data signal DATA takes the low level and the inverted data signal $\overline{\text{DATA}}$ takes the high level, the node N1 takes the low level and the node N2 takes the high level, conversely with the above-described case. The relationships between potentials at respective nodes are shown in FIG. 3. The potential at the node N9 takes the low level and that at the node N10 takes the high level. The transistor TRN11 therefore turns on. The transistor TRN10 turns off, conversely with the above-described case. As a result, a low level signal is outputted from the output terminal I/O. Similar to the transistor TRN10, the transistor TRN11 performs triode action. As a result, under the condition that a load is not connected to the output terminal I/O, the potential at the output terminal I/O can take a level down to the ground potential $V_{SS}$.

Next, the operation of the data output circuit when the output data is changed will be described. The time instant when both the data transfer control signal DXFR1 and inverted data transfer control signal $\overline{\text{DXFR1}}$ take the high level is considered first. After a delay time required for one of the transistors TRN10 and TRN11 to turn off, the inverted data transfer control signal DXFR2 takes the low level.

Figure 4:
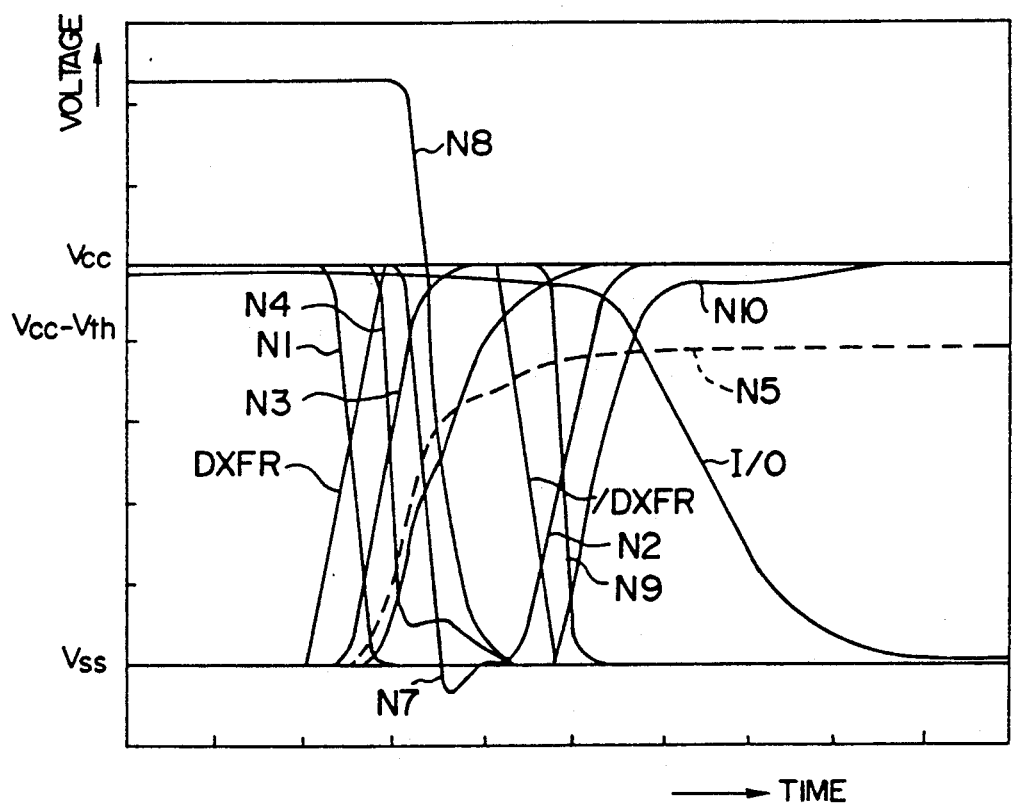
FIG. 4 is a time chart showing potential changes at nodes of the data output circuit when the output data changes from the high level to the low level.

The following description is first directed to the operation of the data output circuit when a low level data signal DATA (high level data signal $\overline{\text{DATA}}$) is inputted under the condition that a high level signal is being outputted from the output terminal I/O with a high level data signal DATA (low level data signal $\overline{\text{DATA}}$) being inputted. Potential changes at respective nodes are shown in FIG. 4.

With both the data transfer control signal DXFR1 and inverted $\overline{\text{DXFR2}}$ taking the high level, the potentials at the nodes N1, N3 and N4 take the low, high and low levels, respectively. When the node N3 takes the high level, the transistor TRN7 turns on and the potential at the node N5 rises to a potential (power supply voltage $V_{CC}$)−(threshold voltage $V_{th}$) to turn on the transistor TRN9. The potentials at the nodes N8, N6 and N7 take the low, high, and low levels, respectively.

After the transistor TRN10 turns off, the inverted data transfer control signal DXFR2 takes the low level. Since the data signal DATA is at a low level and the inverted data signal $\overline{\text{DATA}}$ is at a high level the transistors TRP3 and TRP4 turn on and the node N2 takes the high level. The node N9 takes the low level and the node N10 takes the high level. As a result, the transistor TRN11 turns on and a low level signal is outputted from the output terminal I/O.

Figure 5:
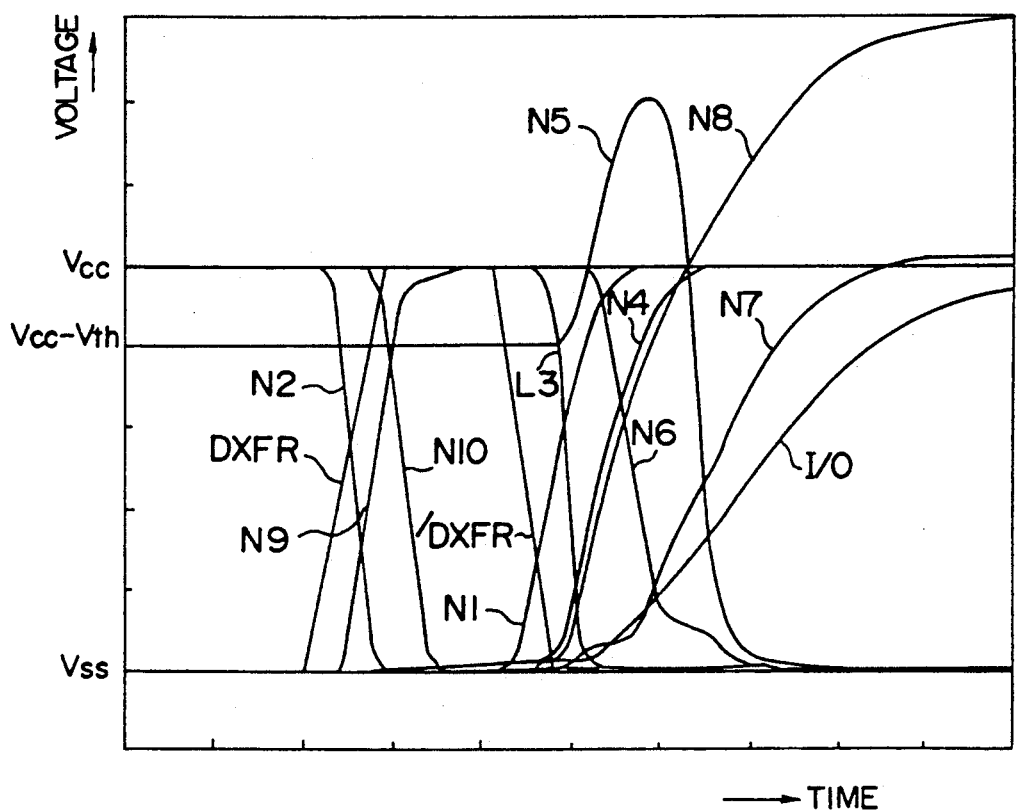
FIG. 5 is a time chart showing potential changes at nodes of the data output circuit when the output data changes from the low level to the high level.

The following description is then directed to the operation of the data output circuit when a high level data signal DATA is inputted under the condition that a low level signal is being outputted from the output terminal I/O with a low level data signal DATA being inputted. Potential changes at respective nodes are shown in FIG. 5. With both the data transfer control signal DXFR and inverted $\overline{\text{DXFR}}$ taking the high level, and with the data signal DATA taking the high level, the N-channel transistors TRN3 and TRN4 turn on, the node N9 takes the high level, and the node N10 takes the low level, to turn off the transistor TRN11.

After the transistor TRN11 turns off, the inverted data transfer control signal DXFR2 takes the low level. With the inverted data signal $\overline{\text{DATA}}$ taking the low level, the transistors TRP1 and TRP2 turn on, and the node N1 takes the high level. With the high level node N1, the transistor TRN10 turns on as described above, and a high level signal is outputted from the output terminal I/O.

As described above, in order to change the output, it is necessary to make the inverted data transfer signal DXFR2 take the low level after one of the transistors TRN10 and TRN11 turns off after the data transfer control signal DXFR1 is set to the high level. In order to change the output at high speed, it is, therefore, necessary to shorten the delay time from when the data transfer control signal DXFR1 is set to the high level to when the inverted data transfer control signal DXFR1 is set to the low level.

In the first embodiment, the activation and inactivation operations of the bootstrap circuit BS are required to be executed within such a delay time in order to change the output. However, there is a limit in shortening the delay time.

Furthermore, a load current from the output terminal I/O while the high level signal is continuously outputted is smaller than that while the output changes from the low level to the high level.

The reason for the smaller load current is as follows. The transistor TRN10 turns on when the gate potential, i.e., the potential at the node N8, rises to a level higher than the potential at the output terminal I/O before the output data change by the threshold voltage $V_{th}$. The transistor TRN10 during the off-state forms a capacitor relative to the semiconductor substrate, and during the on-state forms a capacitor relative to the output terminal I/O.

Figure 2:
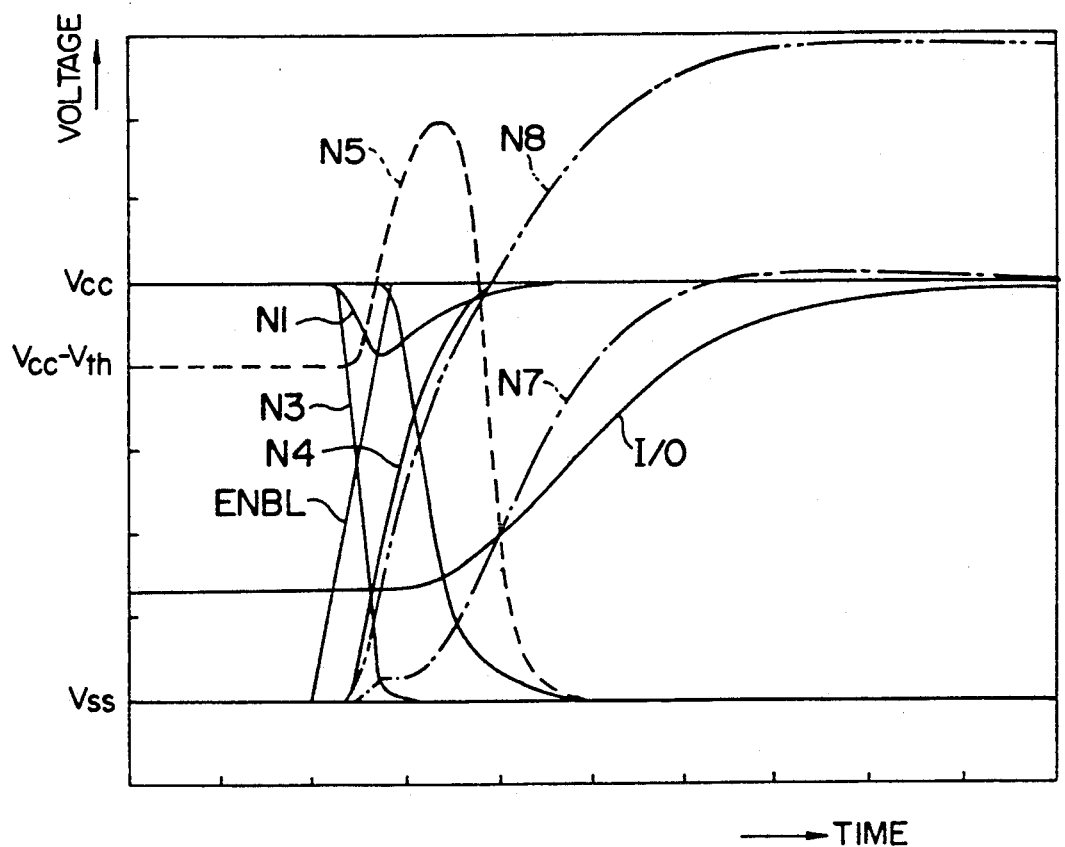
FIG. 2 is a time chart showing potential changes at nodes of the data output circuit when it outputs a high level.

As shown in FIG. 2, the potential at the output terminal I/O rises more slowly than the gate potential (at the node N8). Therefore, even after the gate has been charged, the potential at the output terminal I/O continues to rise and also the gate potential rises. Accordingly, the lower the potential at the output terminal I/O before the output data change, the higher the final gate potential. The gate potential of the transistor TRN10 while the high level signal is continuously outputted is therefore different from that while the output changes from the low level to the high level. An output current becomes smaller while the high level signal is continuously outputted.

Such a phenomenon will become conspicuous as the delay time is shortened. As described above, each time the output is to be changed, the bootstrap circuit BS is once inactivated and thereafter activated. As a result, the time period while the potential at the node N5 rises from the level (power supply voltage $V_{CC}$) − (threshold voltage $V_{th}$) becomes short, resulting in a lower peak level. Therefore, the rise speed of the potential at the node N8 lowers and the gate potential lowers, resulting in a reduced output current from the transistor TRN10.

Figure 6:
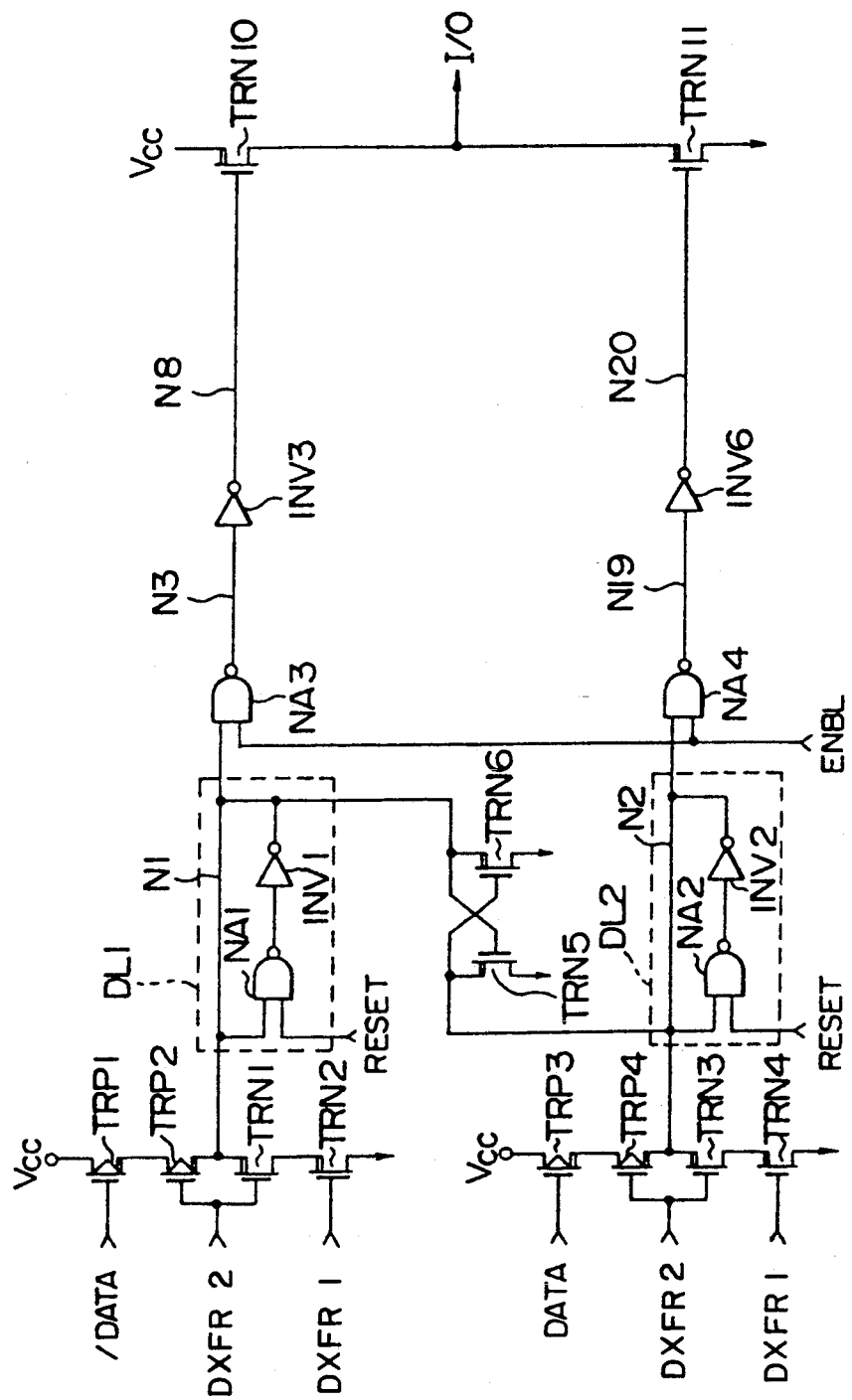
FIG. 6 is a circuit diagram showing the structure of a second embodiment of a data output circuit of a semiconductor integrated circuit device.

A data output circuit capable of shortening the delay time is shown in FIG. 6 as the second embodiment of the present invention. The difference between the second embodiment and the first embodiment shown in FIG. 1 is that an inverter INV3 is used in place of the bootstrap circuit BS. The potential at the node N8 connected to the gate of the transistor TRN10 of the first embodiment circuit shown in FIG. 1 is caused to rise higher than the power supply voltage $V_{CC}$. In the second embodiment circuit shown in FIG. 6, the potential at the node N8 is caused to rise to the power supply voltage $V_{CC}$, allowing a shortened delay time.

In this circuit, the potential at the output terminal I/O rises to the potential (power supply voltage $V_{CC}$) − (threshold potential $V_{th}$) at the most, even if a load is connected to the output terminal I/O. Furthermore, in this circuit, the gate potential of the transistor TRN10 is equal to or lower than the drain potential. Thus it operates as a pentode and reduces the drain current. Therefore, in order to ensure a high level potential at the output terminal I/O, it is necessary to use the transistor TRN10 having a larger size than in the first embodiment. Therefore, if a plurality of output buffer circuits are used, the chip area becomes large.

Figure 7:
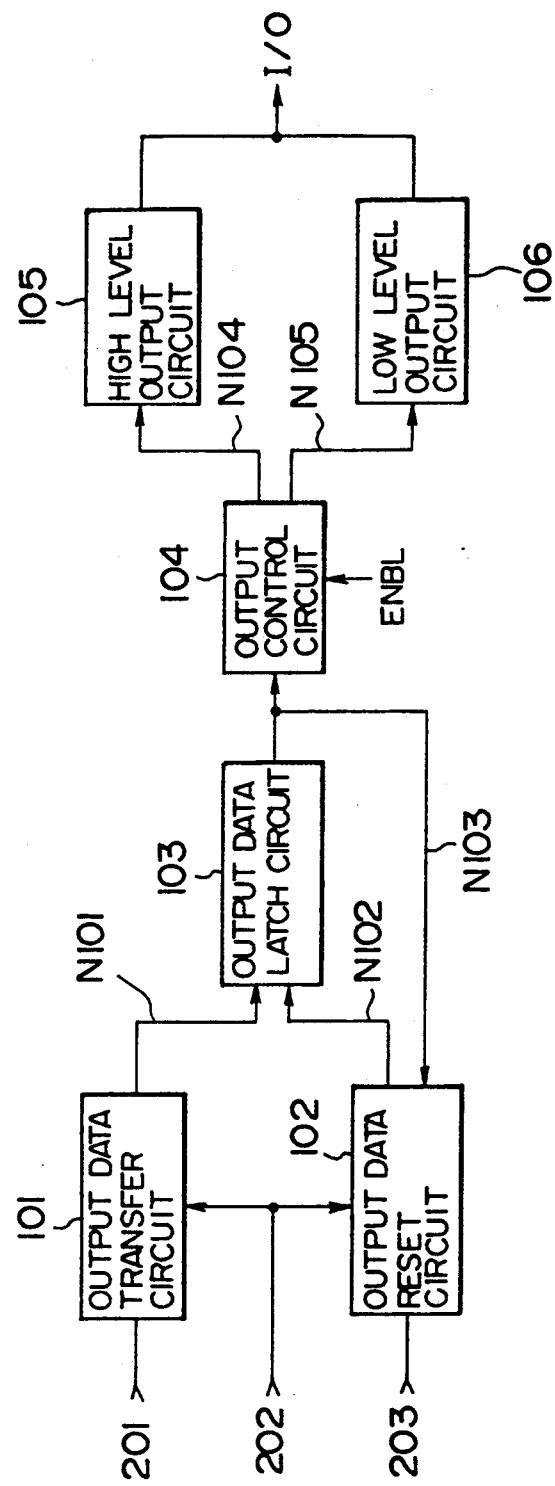
FIG. 7 is a block diagram showing the structure of a third embodiment of a data output circuit of a semiconductor integrated circuit device.

The structure of a data output circuit according to the third embodiment of the present invention is shown in FIG. 7. The output terminals of an output data transfer circuit 101 and an output data reset circuit 102 are connected via nodes N101 and N102 to an output data latch circuit 103. The output terminal of the output data latch circuit 103 is connected via a node N103 to the input terminals of an output control circuit 104 and the output data reset circuit 102. The output terminal of the output control circuit 104 is connected via nodes N104 and N105 to a high level output circuit 105 and a low level output circuit 106. The output terminals of the high level output circuit 105 and low level output circuit 106 are connected to an output terminal I/O.

The output data transfer circuit 101 holds an inputted data signal 202, and transfers it to the output data latch circuit 103 in sync with an output data transfer control signal 201. The output data reset circuit 102 receives the inputted data signal 202 and an output data reset control signal 203, and resets the data outputted at the preceding cycle and held by the output data latch circuit 103. In this case, the new output data is compared with the preceding old output data held by the output data latch circuit 103. If both data are the same, the output data reset circuit 102 does not reset the old data, but allows it to be held. If the data are different, the output data reset circuit 102 resets the old data and makes the output data latch circuit 103 hold the new output data. The output data latch circuit 103 latches the output data supplied from the output data transfer circuit 101 as described above, and can hold either the state that a high level or low level signal is outputted, or the state that neither of the high level and low level signals are outputted.

The output control circuit receives the output data held by the output data latch circuit 103, and controls the output data in response to an output enable signal ENBL. When the output data is outputted, the output control circuit 104 supplies the output data to one of the high level output circuit 105 and low level output circuit 106, depending upon the level of the output data. A high level signal from the high level output circuit 105 and a low level signal from the low level output circuit 106 are outputted from the output terminal I/O.

The third embodiment constructed as above operates in the following manner. Prior to outputting the data, the output data reset control signal 203 is inputted to the output data reset circuit 102. The output data reset circuit 102 compares the new output data with the old output data held by the output data latch circuit 103. If both the data are the same, the output data latch circuit 103 is caused to maintain its holding state. If both the data are different, the output data latch circuit 103 is reset and made to enter the state that neither of the high level and low level signals is held.

When the output data transfer signal 201 is activated and the output data transfer circuit 101 is activated, the output data is supplied to and held by the output data latch circuit 103. The output data reset signal 203 is inactivated and the output data reset circuit 102 is inactivated.

When the output enable signal ENBL is activated, the output control circuit 104 starts operating and sends the output data held by the output data latch circuit 103 to one of the high level and low level output circuits 105 and 106. The output data is outputted from the high level output circuit 105 or low level output circuit 106, via the output terminal I/O to the external circuit.

Figure 8:
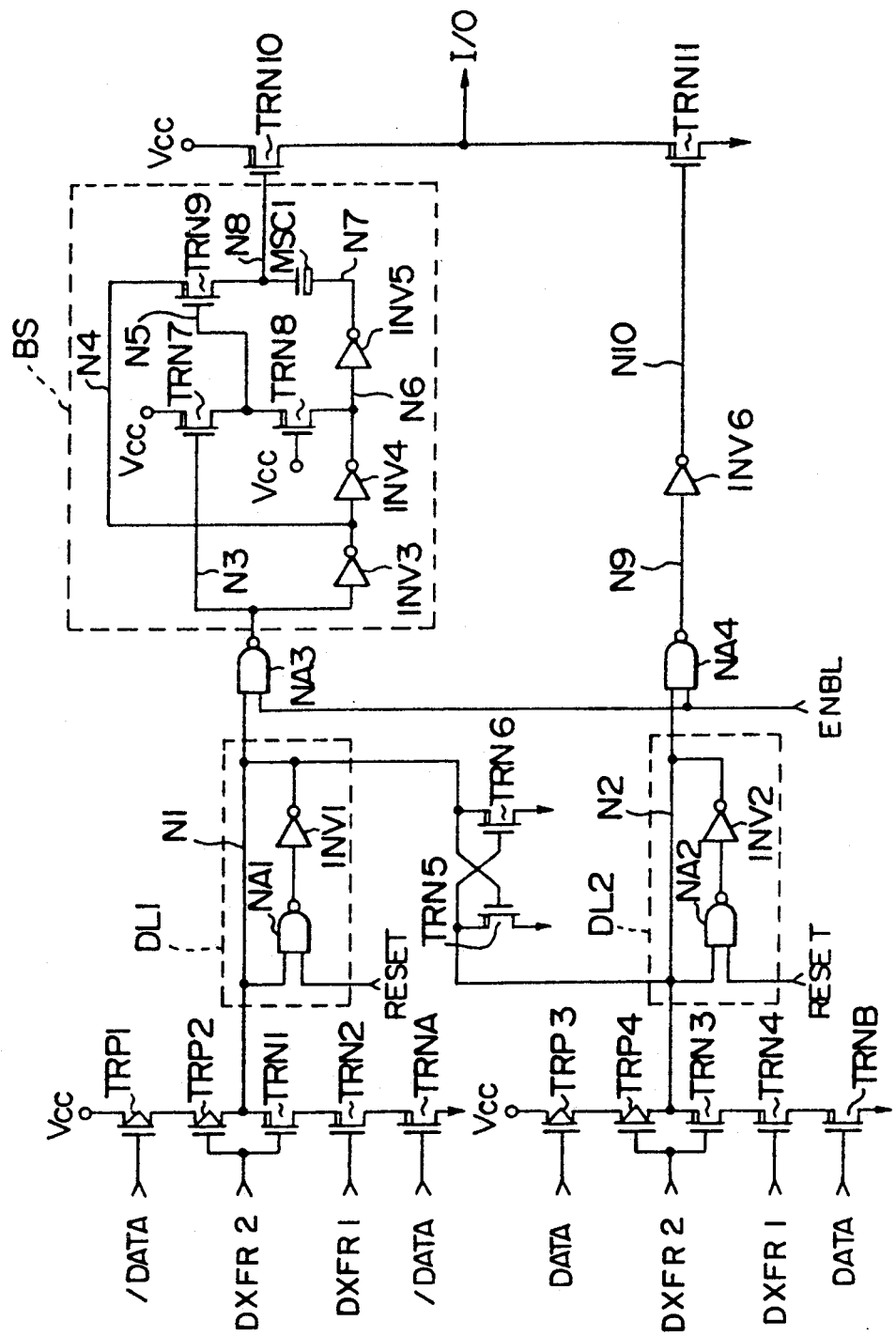
FIG. 8 is a circuit diagram showing the structure of a fourth embodiment of a data output circuit of a semiconductor integrated circuit device.

The fourth embodiment will be described which is an example of particular ones of the data output circuit of the third embodiment. The structure of the data output circuit according to the fourth embodiment is shown in FIG. 8. The difference between the fourth embodiment and the first embodiment is that an N-channel transistor TRNA is connected between the N-channel transistor TRN2 and the ground terminal, and an N-channel transistor TRNB is connected between the N-channel transistor TRN4 and the ground terminal. An inverted data signal $\overline{DATA}$ is inputted to the gate of the transistor TRNA, and a data signal DATA is inputted to the gate of the transistor TRNB. Like elements to those of the first to third embodiments are represented by identical reference numerals, and the description thereof is omitted.

The structure of the fourth embodiment will be described in comparison with the third embodiment shown in FIG. 7. P-channel transistors TRP1 to TRP4 constitute the output data transfer circuit 101. N-channel transistors TRN1 to TRN4, TRNA and TRNB constitute the output data reset circuit 102. Data latch circuits DL1 and DL2 and N-channel transistors TRN5 and TRN6 constitute the output data latch circuit 103. For the bootstrap circuit BS, N-channel transistors TRN7 TRN10, inverters INV3 to INV5, and capacitor MSC1 constitute the high level output circuit 103. A data transfer control signal DXFR and inverted data transfer control signal DXFR1 correspond to the output data transfer control signal 201 and output data reset control signal 203. When the signals DXFR1 and DXFR2 both take the high level, they operate as output data reset control signals, and in the other combinations, they operate as the output data control signal 201.

In the fourth embodiment, the operation of changing the output data is executed in the manner described below. Where the old output data at the preceding cycle is high level and the new output data after the output data change is the same high level. In this case, the data signal DATA is high level, and the inverted data signal $\overline{DATA}$ is low level. When the data transfer control signal DXFR1 and inverted data transfer control signal DXFR2 take the high level, all the transistors TRN1 to TRN4 turn on, the transistor TRNA turns off, and the transistor TRNB turns on. Since the old output data is high level, the node N1 already takes the high level. Since the level at the node N1 does not change after the output data change, the bootstrap circuit BS will not execute an inactivation operation, but continues to hold the present operation state, and the node N8 remains high level. As a result, the transistor TRN10 maintains its on-state without turning on once. Thus, unlike the first embodiment where the bootstrap circuit BS executes an inactivation operation, there is no delay time and the data output operation can be executed at a sufficiently high speed. Furthermore, the level at the node will not lower but maintains the charged state, so that an output current from the transistor TRN10 can be prevented from being decreased.

The case where the old output data is low level and the new output data after the output data change is high level will now be considered. Before the data output change, the node N2 is high level and the node N1 is low level. Therefore, the transistor TRN11 turns off and the transistor TRN10 turns on.

If the old output data is low level, and the new output data after the data output change is the same low level, the high level state at the node N2 is maintained and the transistor TRN11 maintains its on-state without turning off. If the old output data is high level and the new output data is changed to the low level, the state that the node N2 takes the high level changes to the state that the node N1 takes the high level.

As described above, the old output data is compared with the new output data and if the same level output data continues to be outputted, one of the transistors TRN10 and TRN11 turns off depending upon the output data level, without turning off both the transistors. Therefore, if the same level output data continues, the current levels at the nodes N1 and N2 are held to maintain the operation state of the bootstrap circuit BS, to thereby allow high speed data output and prevent an output current from the transistor TRN10 to the output terminal I/O from being lowered.

If a new output data having a different level is outputted, the transistors TRN10 and TRN11 turn off temporarily, and thereafter one of the transistors corresponding to the level of the new output data turns on. In this case, an output current from the transistor TRN10 for outputting a high level signal will not lower, and a necessary level can be ensured.

The above embodiments have been presented only for illustrative purposes, and are not intended to limit the scope of the present invention. For example, in the third embodiment, the output data reset circuit as a comparison means compares the old data and new data, the output data latch circuit temporarily latches the output data, and the output control circuit and high level or low level output circuit as a first or second output means outputs the output data. It is not essential for the third embodiment to take such an arrangement. Furthermore, the particular circuit structure of the fourth embodiment may be changed in various manners by using means having the same functions.

What is claimed is:

1. A data output circuit for a semiconductor integrated circuit device for outputting a data signal in sync with an output enable signal externally supplied, comprising:
    means for comparing a first data signal being outputted presently with a second data signal to be outputted next, when a data signal to be outputted is changed, and judging whether said first and second data signals are the same or different;
    output mean having output transistors for outputting the data signal, said output means temporarily turning off said output transistors and outputting said second data signal in sync with the output enable signal as the data signal if said comparing means judges that said first and second data signals are different, and said output means outputting said second data signal in sync with the output enable signal as the data signal without turning off all said output transistors if said comparing means judges that said first and second data signals are the same.

2. A data output circuit for a semiconductor integrated circuit device for outputting a data signal in sync with an output enable signal externally supplied, comprising:
    an output data latch circuit for latching the data signal;
    an output data reset circuit for receiving a second data signal to be outputted next and an output data reset control signal, comparing said second data signal with a first data signal held by said output data latch circuit, in sync with said output data reset control signal, resetting said output data latch circuit if said first and second output data signals are judged to be different, and making a hold state of said output data latch circuit continue if said first and second output data signals are judged the same;

an output data transfer circuit for receiving said second data signal and an output data transfer control signal, and supplying said second data signal to said output data latch circuit to latch said second data signal in sync with said output data transfer control signal;

an output control circuit for receiving said output enable signal and said second data signal latched by said output data latch circuit, and outputting said second data signal in sync with said output enable signal;

a high level output circuit having an output transistor for a high level signal, said high level output circuit receiving said second data signal if said second data signal outputted from said output control circuit is high level, turning on the output transistor for a high level signal, and outputting said second data signal; and a low level output circuit having an output transistor for a low level signal, said low level output circuit receiving said second data signal if said second data signal outputted from said output control circuit is low level, turning on the output transistor for a low level signal, and outputting said second data signal.

3. A data output circuit for a semiconductor integrated circuit device according to claim 2, wherein:

said output data reset circuit is connected to a first node and a second node, changes the potentials at said first and second nodes to reset potential if said first and second data signals are judged as different, and maintains current potentials at said first and second nodes if said first and second data signals are judged as the same;

said output data latch circuit is connected to said first and second nodes, resets the contents of said output data latch circuit if the potentials at Said first and second nodes are changed to the reset potential, and maintains the current contents of said output data latch circuit if the potentials at said first and second nodes are to be maintained; and said output data transfer circuit changes the potentials at said first and Second nodes to the contents of said second data signal in sync with said output data transfer control signal.

* * * * *